United States Patent [19]

Hafner

[11] 4,118,673
[45] Oct. 3, 1978

[54] PHASE LOCK LOOP CONTROLLED OFFSET LOCAL OSCILLATOR SYSTEM

[75] Inventor: Erich Hafner, Tinton Falls, N.J.

[73] Assignee: The United States of America as represented by the Secretary of the Army, Washington, D.C.

[21] Appl. No.: 876,771

[22] Filed: Feb. 10, 1978

[51] Int. Cl.² ............................................. H03B 3/04
[52] U.S. Cl. ..................................... 331/2; 331/1 A; 331/25; 331/27
[58] Field of Search .................. 331/1 A, 2, 18, 25, 331/27; 325/346, 419, 421, 422, 423

[56] References Cited

U.S. PATENT DOCUMENTS

| | | | |
|---|---|---|---|
| 3,100,871 | 8/1963 | Richardson et al. | 325/419 X |
| 3,588,731 | 6/1971 | Hoeffer et al. | 331/2 |
| 3,626,308 | 12/1971 | Paine et al. | 328/166 |

Primary Examiner—Siegfried H. Grimm
Attorney, Agent, or Firm—Nathan Edelberg; Jeremiah G. Murray; Daniel D. Sharp

[57] ABSTRACT

Apparatus utilizing single sideband techniques for generating a local oscillator signal of high spectral purity which is offset from a relatively wide-band signal generator frequency $f_g = 0.8 - 220$MHz by a constant IF frequency difference $f_o = 46$KHz. The output signal is coupled from one of a plurality of phase locked oscillators having overlapping frequency ranges which act as active filters to obtain improved spectral purity.

9 Claims, 6 Drawing Figures

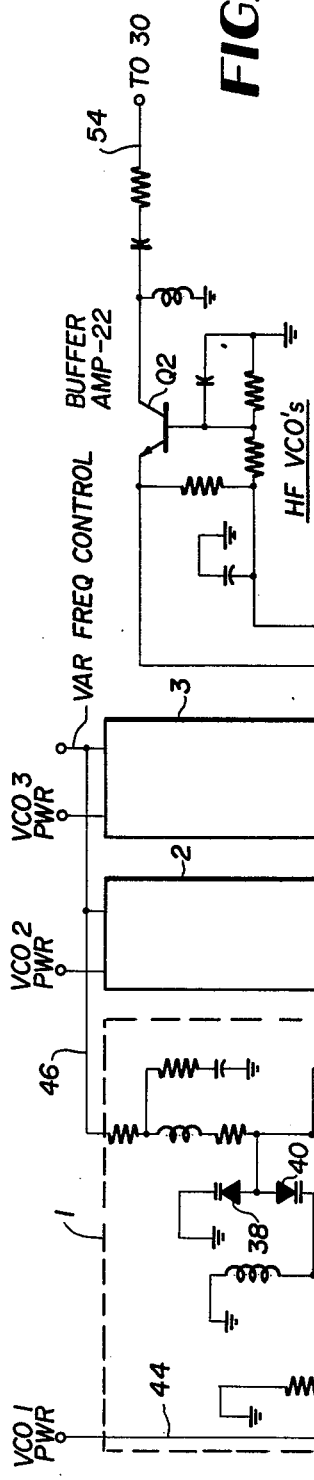
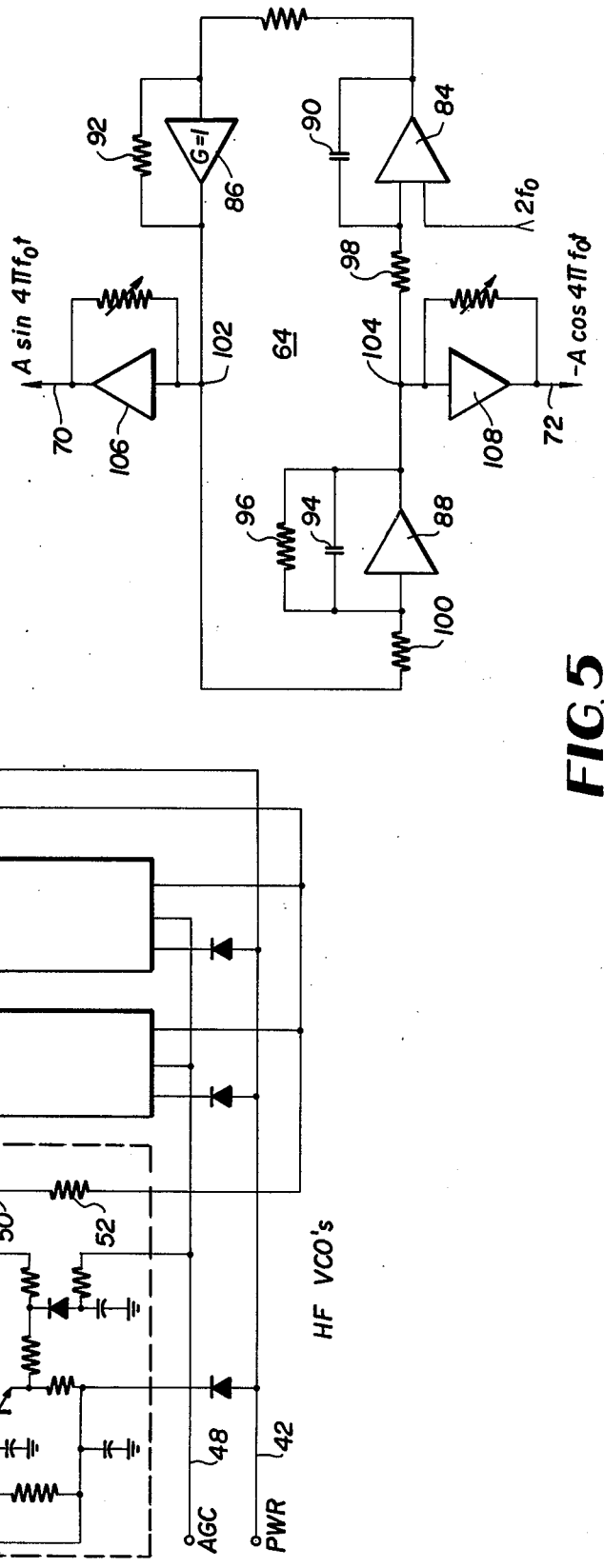
FIG.3
FIG.5

PHASE LOCK LOOP CONTROLLED OFFSET LOCAL OSCILLATOR SYSTEM

The invention described herein may be manufactured and used by or for the Government for governmental purposes without the payment of any royalties thereon or therefor.

BACKGROUND OF THE INVENTION

This invention relates generally to signal oscillators and more particularly to an offset local oscillator for use with a tracking servo bridge detector which is utilized as part of a system for precision bridge-type measurements on quartz crystal resonators.

Apparatus of this type is disclosed in a publication entitled "Implementation of Bridge Measurement Techniques For Quartz Crystal Parameters" by E. Hafner et al. which appeared in Proceedings of The 30th Annual Symposium on Frequency Control (2–4 June, 1976). On p. 96 of this publication there is described an offset local oscillator unit which is powered and controlled by a main tracking bridge detector wherein the offset is produced at half-frequency by phasing type single sideband techniques and then filtering by means of a phase-locked voltage controlled oscillator at the local oscillator frequency.

The following references are typically illustrative of means for generating single sideband signals.

U.S. Pat. No. 3,243,731 — J. W. Erickson
U.S. Pat. No. 3,605,017 — A. B. Chertok et al.

The present invention is directed to another means for providing a signal offset by a fixed frequency from a generator input for use as the local oscillator in the receiver section of a tracking servo bridge detector.

SUMMARY

Briefly, the subject invention comprises an offset local oscillator circuit comprising one of a plurality of band switched voltage controlled oscillators which is phase locked to an offset reference source through a single sideband generator circuit which is responsive to a multiple (×2) of a frequency generator input frequency $f_g$ and twice the offset frequency $f_o$. The lower sideband signal of the single sideband generator is divided by a factor of two and coupled to a digital phase-frequency detector along with a sample of the selected voltage controlled oscillator frequency which operates to generate a variable frequency control signal which is fed back to the voltage controlled oscillator through a loop filter consisting of, for example, a Cauer low pass filter.

BRIEF DESCRIPTION OF THE DRAWINGS

FIG. 3 is an electrical schematic diagram illustrative of one of a set of voltage controlled oscillators shown in the block diagram in FIG. 2;

FIG. 5 is an electrical schematic diagram illustrative of the dual integrator resonator included in the single sideband circuitry shown in FIG. 4.

DESCRIPTION OF THE PREFERRED EMBODIMENT

Figure 1:
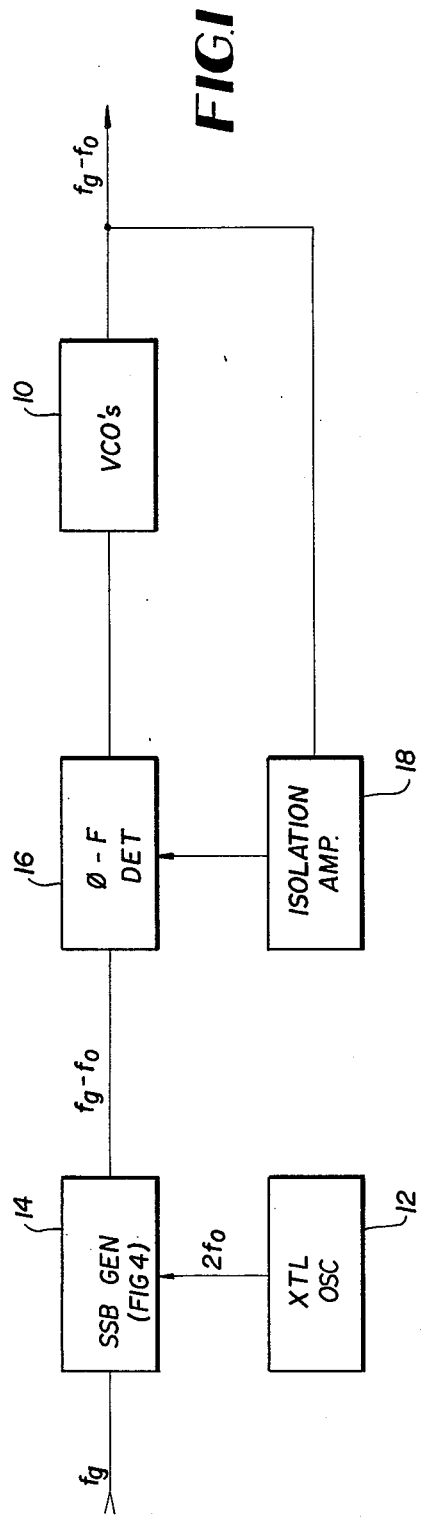
FIG. 1 is an electrical block diagram illustrative of the basic embodiment of the subject invention.

Referring first to FIG. 1 which consists of the basic block diagram of the subject invention, reference numeral 10 designates a set of band switched voltage controlled oscillators (VCO) one of which is selectively operable and phase locked to an offset signal derived from a single sideband generator 14 with the offset determined by the offset reference signal which is generated by a crystal oscillator 12. The offset reference signal which at a frequency twice the desired offset is fed to a single sideband generator circuit 14. An input frequency $f_g$ which is selectively variable over a wide frequency range, for example, 0.8MHz and 220MHz is also coupled to the circuit 14. The single sideband generator doubles the input frequency and, as will be shown, generates a lower sideband frequency $f_g$-$f_o$ which is applied to a phase-frequency detector 16 which receives a VCO sample in a feedback loop including an isolation amplifier 18 for generating a control signal for the VCO in operation.

Figure 2:
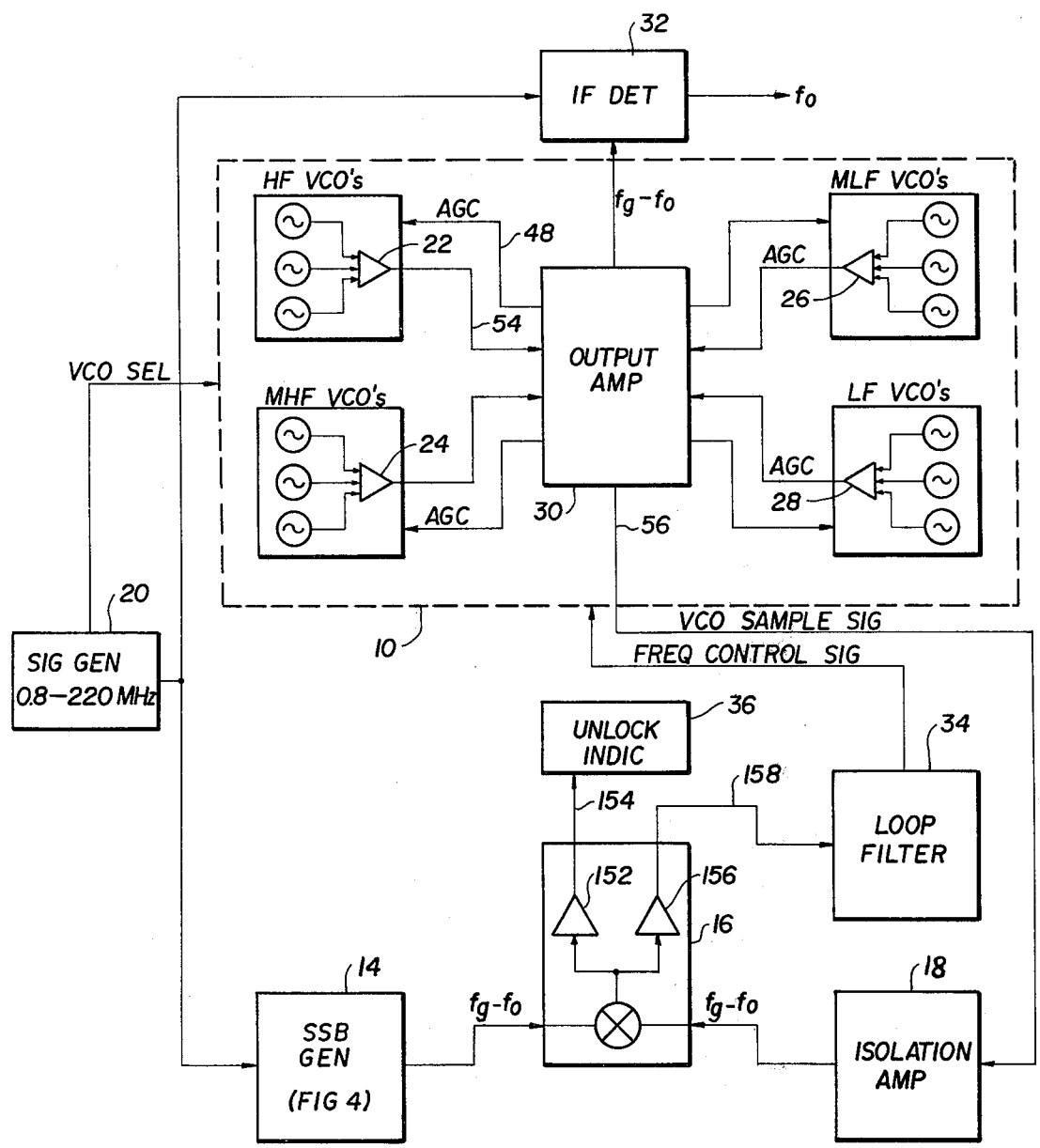
FIG. 2 is a detailed block diagram of the system shown in FIG. 1.

Referring now to FIG. 2 wherein there is disclosed a more detailed block diagram of the subject invention the set of voltage controlled oscillators 10 shown in FIG. 1 consists of four frequency ranges of VCO's which by selective switching of the voltage controlled oscillators 1 through 12 from the input signal generator 20 is adapted to cover the range of the generator (0.8 to 220MHz) in the overlapping frequency ranges as shown in Table I.

TABLE I

| VCO No. | Freq. Range (MHz) |
|---|---|
| 1 | 125–220 |
| 2 | 75–140 |
| 3 | 45–85 |
| 4 | 28–52 |
| 5 | 17–32 |
| 6 | 11–20 |
| 7 | 7–13 |
| 8 | 5–9 |
| 9 | 3.2–6 |
| 10 | 2–3.7 |
| 11 | 1.3–2.3 |
| 12 | 0.8–1.5 |

The oscillators 1 to 12 are coupled in groups of three to buffer amplifiers 22, 24, 26 and 28. VCO selection is accomplished by selective power application to one of the VCO's which is thereby rendered operative. The selected one of the VCO's 1–12 is adapted to output a frequency of $f_g$-$f_o$ through an output amplifier 30 which is adapted to be coupled to, for example, an IF detector circuit 32 in the receiver section of a tracking servo bridge detector, not shown, which will then produce a constant IF frequency of $f_o$ = 46kHz, for example, as the signal generator 20 varies in output frequency $f_g$ over the range from 0.8 to 220MHz.

Frequency control of the selected VCO is provided by a sample of $f_g$-$f_o$ signal applied to the output amplifier 30 being coupled to the isolation amplifier circuit 18 whose output is coupled to the phase-frequency detector circuit 16 along with the lower sideband frequency $f_g$-$f_o$ output from the single sideband generator 14. The control voltage output from the phase-frequency detector 16 is coupled back to the selectively operative VCO through a loop filter 34. The phase-frequency detector is also adapted to provide a signal to an indicator circuit 36 which is adapted to signal an unlocked condition circuit operation.

As noted, the local oscillator output signal is generated by a series of twelve VCO's which cover the frequency range between 0.8 and 220MHz. Each VCO has a tuning ratio of about 1.85:1 and adjacent ranges have at least 10% overlap as indicated by Table I.

Referring to FIG. 3, there is disclosed as an illustrative example, one set of VCO's for high frequency operation including the oscillator circuits 1, 2 and 3 with the oscillator circuit 1 being shown in its schematic details. Typically, voltage controlled oscillator 1 consists of a varactor tuned grounded-base transistor amplifier including transistor $Q_1$ having positive feedback from collector to emitter. The impedance step-down in the feedback path, a necessary condition for oscillation, is accomplished by tapping off at the junction of two series connected tuning varactors 38 and 40. One power supply potential required for operation is constantly applied on buss 42; however, selective operation is provided by a second power supply potential being connected to circuit lead 44 which supply potential is provided in accordance with the control from the signal generator 20. Frequency control as provided by the varactor diodes 38 and 40 is effected by means of the control signal buss 46 which is adapted to be connected to the output of the loop filter 34 shown in FIG. 2. An automatic gain control voltage is applied to the oscillator circuit via an AGC buss 48 which couples back to the output amplifier 30 shown in FIG. 2. The output RF frequency of the oscillator 1 is capacitively coupled to the buffer amplifier 22 including a transistor $Q_2$ by means of the capacitor 50 and resistor 52 coupled to the common connection of the varactor diodes 38 and 40. The RF output is supplied to an RF signal buss 54 which couples to the output amplifier 30. In addition to being coupled to the IF detector 32, the output amplifier 30 provides a VCO sample via signal buss 56 to the isolation amplifier 18 which in turn provides one input $f_g$-$f_o$ to the phase-frequency detector 16.

Figure 4:
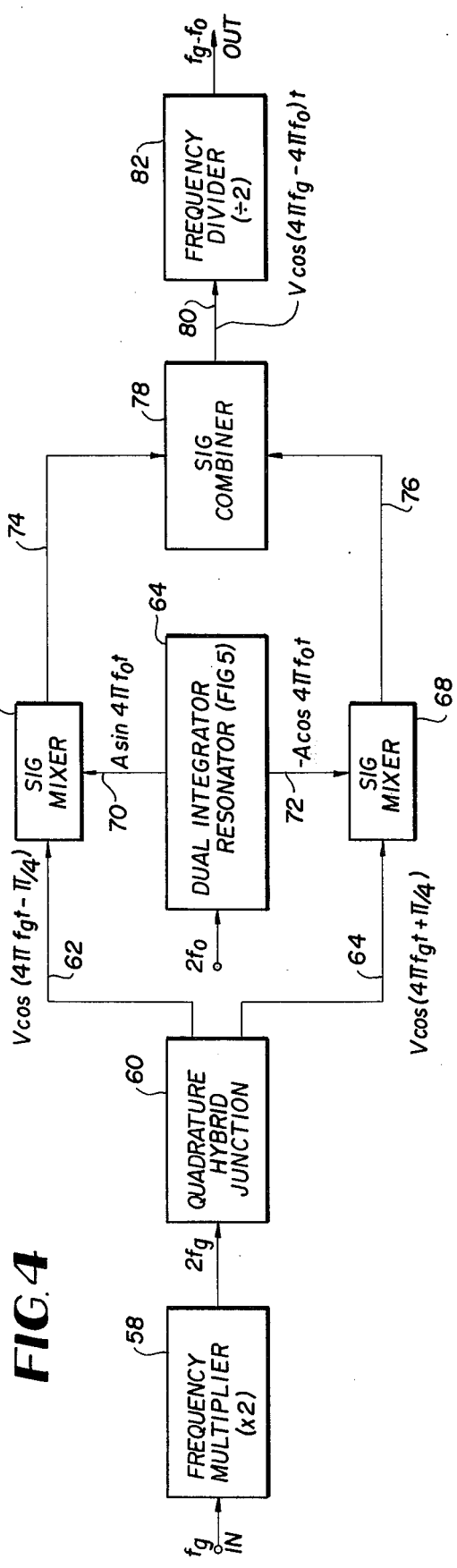
FIG. 4 is an electrical schematic diagram illustrative of the single sideband generator circuitry shown in FIGS. 1 and 2.

The other input to the phase-frequency detector 16 is provided by the single sideband generator circuitry 14 shown in FIG. 4 which operates on the principle of combining two properly phased double sideband signals, with suppressed carrier, such that the upper sidebands cancel one another and the lower sidebands add. The implementation shown in FIG. 4 operates at twice the signal frequency $f_g$ to assure that, after division by two of the lower sideband frequency there are no spectral components in the local oscillator signal which can give rise to mixing products at the IF frequency in the IF detector 32 shown in FIG. 2. Accordingly, the embodiment of the single sideband generator shown in FIG. 4 includes a frequency multiplier (×2) circuit 58 consisting of, for example, a phase locked oscillator to prevent direct feedthrough of the $f_g$ signal. The output of the frequency multiplier at a frequency of $2f_g$ is fed to a quadrature hybrid junction 60 which splits the signal inputted thereto into two equal amplitude components 90° out of phase with respect to one another, said signals being designated, for example, $V \cos(4\pi f_g t - \pi/4)$ and $V \cos(4\pi f_g t + \pi/4)$ which respectively are coupled to signal busses 62 and 64. A typical example of a quadrature hybrid junction is a model QH series manufactured by Merrimac Research & Development, Inc. or Model JB series, marketed by Anzak Electronics. Such apparatus provides an amplitude equality of within 0.5db and a phase deviation from quadrature of less than 3°.

Two quadrature signals at twice the IF frequency, i.e. $2f_o$ are derived from the crystal oscillator 12 shown in FIG. 1 through a dual integrator resonator circuit 64 shown in greater detail in FIG. 5. These outputs designated $A \sin 4\pi f_o t$ and $-A \cos 4\pi f_o t$ are respectively applied to balanced signal mixers 66 and 68 via signal busses 70 and 72. The output of the mixers 66 and 68 appearing on signal busses 74 and 76 comprise two properly phased double sideband signals which are then fed to a signal combiner 78 which acts to cancel the upper sidebands and provide a lower sideband signal of $V \cos(4\pi f_g - 4\pi f_o) t$ on circuit buss 80. This lower sideband signal is fed into a frequency divider (÷2) circuit 82 which is adapted to provide a square wave output which is offset from the frequency $f_g$ by the amount $f_o$.

Prior to discussing the system in further detail, a dual integrator resonator circuit shown in FIG. 5 will briefly be discussed. This circuit basically consists of three operational amplifiers 84, 86 and 88. Amplifier 84 includes a feedback capacitor 90 coupled between its output and one input and thus providing a first integrator circuit. The operational amplifier 84 additionally includes a second input to which is applied the output of the crystal oscillator 12 shown in FIG. 1 and having a frequency $2f_o$. The second operational amplifier coupled to the output of the first integrator circuit consists of a unity gain amplifier having a gain setting resistor 92 coupled thereacross. The unity gain amplifier is coupled to the input of a second integrator circuit consisting of the operational amplifier 88 having a feedback integrator capacitor 94 and a damping resistor 96 coupled thereacross. Both integrator circuits include input resistors 98 and 100 which are adapted to control their respective integrator time constants. Such a circuit is generally outlined in the text book entitled "Analog Computation In Engineering Design" by A. E. Rogers, et al., McGraw-Hill Company, New York, 1960 at pages 126–128. Accordingly, circuit junction 102 is adapted to provide a signal $A \sin 4\pi f_o t$ while circuit junction 104 is adapted to provide a signal $-A \cos 4\pi f_o t$. Attenuator means consisting of variable gain operational amplifiers 106 and 108 are thus adapted to provide the required signals on signal busses 70 and 72 which couple into the balanced mixers 66 and 68.

Figure 6:
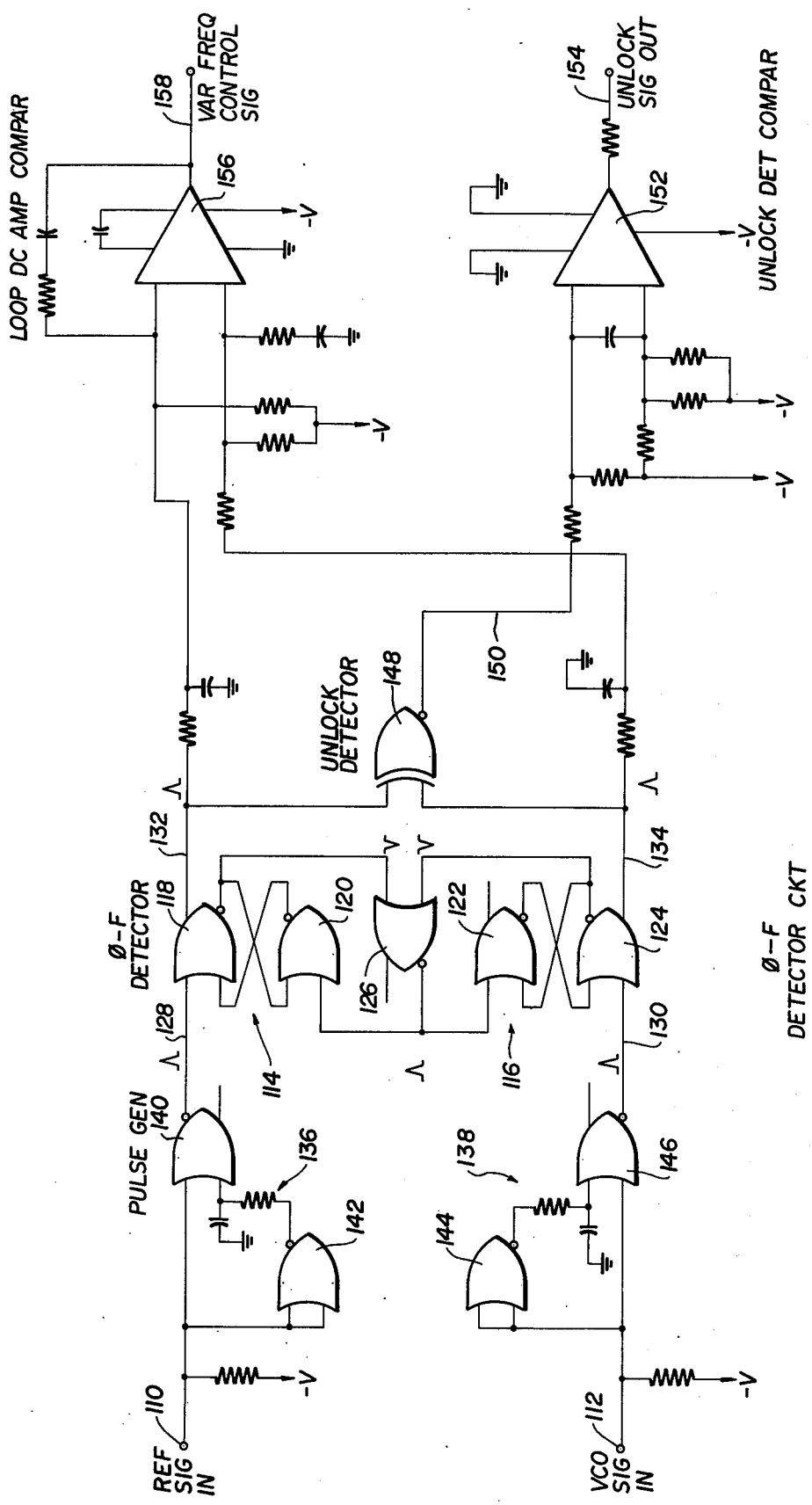
FIG. 6 is an electrical schematic diagram illustrative of the digital phase-frequency detector circuitry shown in FIG. 2.

Referring now to FIG. 6, there is schematically shown the phase-frequency detector circuitry 16 shown in FIGS. 1 and 2. The primary function of this circuit is to compare the phases of the single sideband reference appearing at the output of the ÷2 frequency divider circuit 82 (FIG. 4) with the VCO sample signal from the isolation amplifier 18 shown in FIG. 2 and providing an error signal for the phase lock loop. These signals are respectively applied to signal terminals 110 and 112. Secondary functions are to provide loop gain, to detect an unlocked condition and to provide frequency discriminator action to permit lock up. The latter function is very important in a loop of the type disclosed where a wide range VCO is to be locked with a narrow loop bandwidth. The digital logic configuration shown in FIG. 6 basically consists of two set-reset latches 114 and 116, each implemented with 2-input positive NAND gates 118 and 120 and 122 and 124 respectively. A fifth NAND gate 126 is interconnected between the latches 114 and 116 and is utilized as a reset generator.

The operation of the circuitry is as follows. The first input pulse to arrive sets its corresponding latch. The circuit will remain in this state until a pulse arrives at the other latch input irrespective of whether or not additional pulses arrive at the first input. The pulse at the other input first sets that latch and then the reset gate immediately resets both latches. Thus the circuit will produce the following outputs where, for example, the frequency $f_1$ appears on circuit lead 128 to the latch 114 and the frequency $f_2$ appears on circuit lead 130 to the latch 116. Where $f_1$ is greater than $f_2$, the output will appear on circuit lead 132 as a variable duty ratio pulse train variable from approximately 0 to 100% at the rate $f = f_1 - f_2$. The output from latch 116 appearing on circuit lead 134 will be low except for the duration of the narrow input pulse appearing on circuit lead 130. However, if $f_2$ is greater than $f_1$, the outputs on circuit leads 132 and 134 will be the reverse of that described above. If, on the other hand, $f_1 = f_2$, one of the two outputs will be low except for the duration of the narrow input pulse. The other output will be a certain fixed duty ratio which is dependent upon the phase relation of the two input signals.

Since the latches 114 and 116 require short pulses of positive polarity, the single sideband signal input at terminal 110 and the VCO sample signal applied to terminal 112 are fed to pulse generator circuits 136 and 138 consisting of the intercoupled NAND gates 140, 142, 144 and 146. The phase-frequency detector consisting of the latches 114 and 116 produces coincident output pulses on circuit leads 132 and 134, respectively, only under locked condition. The coincidence of the detector pulses is sensed by an exclusive NOR logic gate 148 which has its output appearing on circuit lead 150 high when the loop is locked, but a variable duty ratio output pulse train when the loop is unlocked. A comparator amplifier 152 accordingly is coupled to the signal lead 150 and is adapted to drive an indicator device 36 shown in FIG. 2 which may be, for example, an unlock-alarm light, not shown. The unlock-alarm signal thus appearing on signal line 154 will provide a warning of any of the following conditions: no reference signal, no oscillator signal, the reference signal is outside of the lock range of the oscillator, the existence of AC on the lock loop for any reason, failure of the VCO output amplifier 30, isolation amplifier 18, oscillator 12, or the single sideband generator 14. Under locked conditions, however, a comparator circuit amplifier 156 coupled to circuit leads 132 and 134 will provide a control signal at terminal 158 which is adapted to be coupled back to the frequency control buss 46 shown in FIG. 3 through the loop filter 34.

The importance of the digital implementation of the phase-frequency detector is its insensitivity to phase discontinuities of the input signals. The circuit is thus tolerant of continuous phase jitter on the input signals with a deviation of up to a considerable fraction of a carrier period, but will interrupt a sudden phase "glitch" as a frequency error which will drive the detector against the stop. Loop filtration will not materially smooth such a disturbance of the broadband phase-frequency detector itself. It is especially important in this application to avoid a quasi-coherent pulsed noise pick up which can drift through the reference comparator threshold, causing a sudden phase discontinuity which can seriously perturb the lock loop.

The loop filter 34 shown in FIG. 2 is preferably a Cauer (elliptic) low pass filter. While this loop may be of any conventional design, the loop bandwidth must be wide enough to ensure a low noise level near the carrier, and to provide adequate response speed for lock up and sweeping while serving as an effective filter for spurious sidebands. When desirable, the loop filter including the Cauer low pass filter may be coupled to a varactor linearizing amplifier.

Thus what has been shown and described is an offset local oscillator for use with a tracking servo bridge detector which first produces a crude offset signal by phasing-type signal sideband techniques and then using a phase locked oscillator as an active filter to provide a frequency of a constant incremental offset from an input frequency variable over a wide range. This output serves as a local oscillator signal for a sensitive heterodyne detector which is substantially free of direct generator input frequency components to avoid any spurious receiver response.

Although the present invention has been described with a certain degree of particularity, it should be understood that the present disclosure has been made by way of example only, and that numerous changes in the details in the circuitry shown may be resorted to without departing from the spirit or scope of the present invention.

Accordingly, I claim as my invention:

1. A local oscillator providing an output signal having a frequency which is offset by a constant increment $f_o$ from the frequency $f_g$ of an input signal which is variable over a relatively wide frequency range, comprising in combination:

means for receiving said input signal;

an offset reference frequency source providing a signal having a frequency related to $f_o$ by a predetermined fixed factor;

single sideband generator circuit means coupled to said receiving means and said reference frequency source and being responsive to respective signals provided thereby to provide a lower sideband signal $f_g - f_o$;

a selected one of a plurality of signal controlled variable frequency oscillators being operable to generate an $f_g - f_o$ output signal, said plurality of oscillators each being operable over predetermined portions of said relatively wide frequency range; and a phase lock loop for said selected one oscillator including, means coupled to said selected one oscillator for sampling a portion of said output signal, detector circuit means coupled to said single sideband generator circuit means and said signal sampling means coupled to said one oscillator and being responsive to the relative phase of said single sideband signal and the sample portion of said output signal to provide a frequency control signal for said one signal controlled variable oscillator, and means coupling said frequency control signal to said one signal controlled variable oscillator.

2. A local oscillator as defined by claim 1 wherein said single sideband generator circuit means includes:

circuit means coupled to said input signal and being operable to increase said frequency $f_g$ by said predetermined factor;

first quadrature signal generator means coupled to said circuit means coupled to said input signal providing a pair of quadrature signals derived from $f_g$ increased in frequency;

second quadrature signal generator means coupled to said offset frequency source for providing a pair of quadrature signals derived from $f_o$ increased by said predetermined factor;

a pair of balanced mixers coupled to said first and second quadrature signal generator means and being responsive to respective like phase signals therefrom to provide upper and lower sideband signals;

signal combining circuit means coupled to said pair of balanced mixers and being operable to output the lower sideband signal; and circuit means coupled to said signal combining circuit means and being operable to decrease the lower sideband signal frequency by said predetermined factor to provide said $f_g-f_o$ signal.

3. The local oscillator as defined by claim 1 wherein said predetermined fixed factor is $n$ where $n$ is an integer.

4. The local oscillator as defined by claim 3 wherein $n$ is equal to 2.

5. The local oscillator as defined by claim 2 wherein said first quadrature signal generator means comprises a quadrature hybrid junction.

6. The local oscillator as defined by claim 2 wherein said second quadrature signal generator means comprises a dual integrator resonator circuit.

7. The local oscillator as defined by claim 6 wherein said dual integrator resonator circuit comprises a first integrator circuit having a dual input and a single output and additionally including circuit means coupling one input to said offset reference frequency source;

a second integrator circuit means having an input and an output and including circuit means coupling the output thereof to the other input of said first integrator circuit;

signal inverter means coupled between the output of said first integrator circuit and the input of said second integrator circuit, said pair of quadrature signals being provided at the output of said signal inverter means and the output of said second integrator circuit means.

8. The oscillator circuit as defined by claim 7 wherein said first and second integrator circuit means are comprised of operational amplifiers configured as integrator circuits and wherein said signal inverter means comprises a unity gain operational amplifier.

9. The oscillator as defined by claim 8 and additionally including amplitude control circuit means coupling said pair of quadrature signals to said pair of balanced mixers.

* * * * *